US010700087B2

(12) United States Patent
Han et al.

(10) Patent No.: US 10,700,087 B2
(45) Date of Patent: Jun. 30, 2020

(54) MULTI-LAYER STACKS FOR 3D NAND EXTENDIBILITY

(71) Applicant: Applied Materials, Inc., Santa Clara, CA (US)

(72) Inventors: Xinhai Han, Santa Clara, CA (US); Deenesh Padhi, Sunnyvale, CA (US); Er-Xuan Ping, Fremont, CA (US); Srinivas Guggilla, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/151,467

(22) Filed: Oct. 4, 2018

(65) Prior Publication Data
US 2019/0115365 A1 Apr. 18, 2019

Related U.S. Application Data

(60) Provisional application No. 62/571,565, filed on Oct. 12, 2017.

(51) Int. Cl.
| | | |
|---|---|---|
| H01L 21/76 | (2006.01) |
| H01L 27/11582 | (2017.01) |
| H01L 21/311 | (2006.01) |
| H01L 21/02 | (2006.01) |
| H01L 27/1157 | (2017.01) |

(52) U.S. Cl.
CPC .. *H01L 27/11582* (2013.01); *H01L 21/02164* (2013.01); *H01L 21/31116* (2013.01); *H01L 27/1157* (2013.01)

(58) Field of Classification Search
CPC ......... H01L 21/02164; H01L 21/31116; H01L 27/11582; H01L 27/1157

USPC ........................... 257/321, 324; 438/42, 400
See application file for complete search history.

(56) References Cited

U.S. PATENT DOCUMENTS

| | | | |
|---|---|---|---|
| 9,324,731 B1* | 4/2016 | Lai ................... | H01L 27/11565 |
| 9,659,955 B1 | 5/2017 | Sharangpani et al. | |
| 9,960,045 B1 | 5/2018 | Purayath et al. | |
| 9,985,049 B1* | 5/2018 | Sandhu ............ | H01L 27/11582 |
| 9,991,274 B2* | 6/2018 | Yasuda ............. | H01L 27/11582 |
| 10,115,730 B1* | 10/2018 | Baraskar ........... | H01L 27/11582 |
| 10,290,647 B2* | 5/2019 | Noguchi ........... | H01L 21/02211 |
| 2010/0181610 A1 | 7/2010 | Kim et al. | |
| 2016/0064532 A1* | 3/2016 | Makala ............. | H01L 27/11524 |
| | | | 257/316 |
| 2016/0071861 A1 | 3/2016 | Serov et al. | |

(Continued)

OTHER PUBLICATIONS

International Search Report and Written Opinion for International Application No. PCT/US2018/055152 dated Mar. 11, 2019.

*Primary Examiner* — Tan N Tran
(74) *Attorney, Agent, or Firm* — Patterson + Sheridan, LLP

(57) ABSTRACT

Embodiments described herein relate to methods and materials for fabricating semiconductor devices, such as memory devices and the like. In one embodiment, a memory layer stack includes materials having differing etch rates in which one material is selectively removed to form an airgap in the device structure. In another embodiment, silicon containing materials of a memory layer stack are doped or fabricated as a silicide material. In another embodiment, a silicon nitride material is utilized as an interfacial layer between oxide containing and silicon containing layers of a memory layer stack.

20 Claims, 16 Drawing Sheets

(56) References Cited

U.S. PATENT DOCUMENTS

| | | |
|---|---|---|
| 2016/0086972 A1 | 3/2016 | Zhang et al. |
| 2016/0111434 A1 | 4/2016 | Pachamuthu et al. |
| 2016/0181271 A1 | 6/2016 | Yada et al. |
| 2016/0268209 A1 | 9/2016 | Pachamuthu et al. |
| 2016/0268283 A1 | 9/2016 | Kitamura et al. |
| 2017/0077114 A1* | 3/2017 | Yoshimori ............ H01L 23/528 |

\* cited by examiner

MULTI-LAYER STACKS FOR 3D NAND EXTENDIBILITY

CROSS-REFERENCE TO RELATED APPLICATIONS

This application claims benefit to U.S. Provisional Patent Application No. 62/571,565, filed Oct. 12, 2017, the entirety of which is herein incorporated by reference.

BACKGROUND

Field

Embodiments of the present disclosure generally relate to methods and materials for forming semiconductor devices. More specifically, embodiments described herein relate to multi-layer stacks for three dimensional (3D) not AND (NAND) extendibility.

Description of the Related Art

The designs of memory and other semiconductor devices have undergone rapid development in recent years. Current memory devices are able to retain stored data for a very long period of time without applying a voltage thereto, and the reading rate of such memory devices is relatively high. It is relatively easy to erase stored data and rewrite data into the memory devices. Thus, memory devices have been widely used in micro-computers, and automatic control systems, etc. To increase the bit density and reduce the cost per bit of memory devices, 3D NAND (three-dimensional Not AND) memory devices have been developed. Other memory devices, such as ReRAM (resistive random access memory), and advanced hardmask materials are also being developed to further facilitate advances in the semiconductor industry.

Vertical gate 3D memory cells are being explored for 3D NAND technologies to reduce cost as the number of memory cell layers increase. Oxide/silicon and oxide/nitride layer stacks are useful due to material integration advantages, but with an increasing number of memory cell layers, thickness of the layers becomes a limiting factor. Thus, reducing the thickness of the memory cell layers is desirable, however, issues of oxide quality (i.e. breakdown voltage), silicon resistivity, and high aspect ratio etching persist with reduced layer thickness.

Thus, what is needed in the art are improved methods and materials for fabricating semiconductor devices. More specifically, what is needed are multi-layer stacks for 3D NAND extendibility.

SUMMARY

In one embodiment, a memory device fabrication method is provided. The method includes forming a hole in a stack of alternating insulator layers and memory cell layers. The insulator layers include a second oxide material layer disposed between a plurality of first oxide material layers. A first portion of each memory cell layer is removed to form a plurality of first cavities, a charge trap material is deposited in the plurality of first cavities, and a second portion of each memory cell is removed to form a plurality of second cavities. A control gate is formed within each of the second cavities and the second oxide material is removed to form an air gap.

In another embodiment, a memory device fabrication method is provided. The method includes forming a hole in a stack of alternating insulator layers and memory cell layers. The insulator layers include a nitride material layer disposed between a plurality of first oxide material layers. A first portion of each memory cell layer is removed to form a plurality of first cavities, a charge trap material is deposited in the plurality of first cavities, and a second portion of each memory cell is removed to form a plurality of second cavities. A control gate is formed within each of the second cavities and the nitride material is removed to form an air gap.

In yet another embodiment, a three-dimensional NAND device is provided. The device includes a first memory cell coupled to a gate oxide layer and a second memory cell coupled to the gate oxide layer. An air gap is disposed between the first memory cell and the second memory cell and an oxide material layer is disposed on surface of the first memory cell and the second memory cell adjacent to the air gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods and materials for fabricating semiconductor devices, such as memory devices and the like. In one embodiment, a memory layer stack includes materials having differing etch rates in which one material is selectively removed to form an airgap in the device structure. In another embodiment, silicon containing materials of a memory layer stack are doped or fabricated as a silicide material to reduce sheet resistance of the silicon containing material. In another embodiment, a silicon nitride material is utilized as an interfacial layer between oxide containing and silicon containing layers of a memory layer stack to improve adhesion between the oxide and silicon containing layers.

Figure 1:
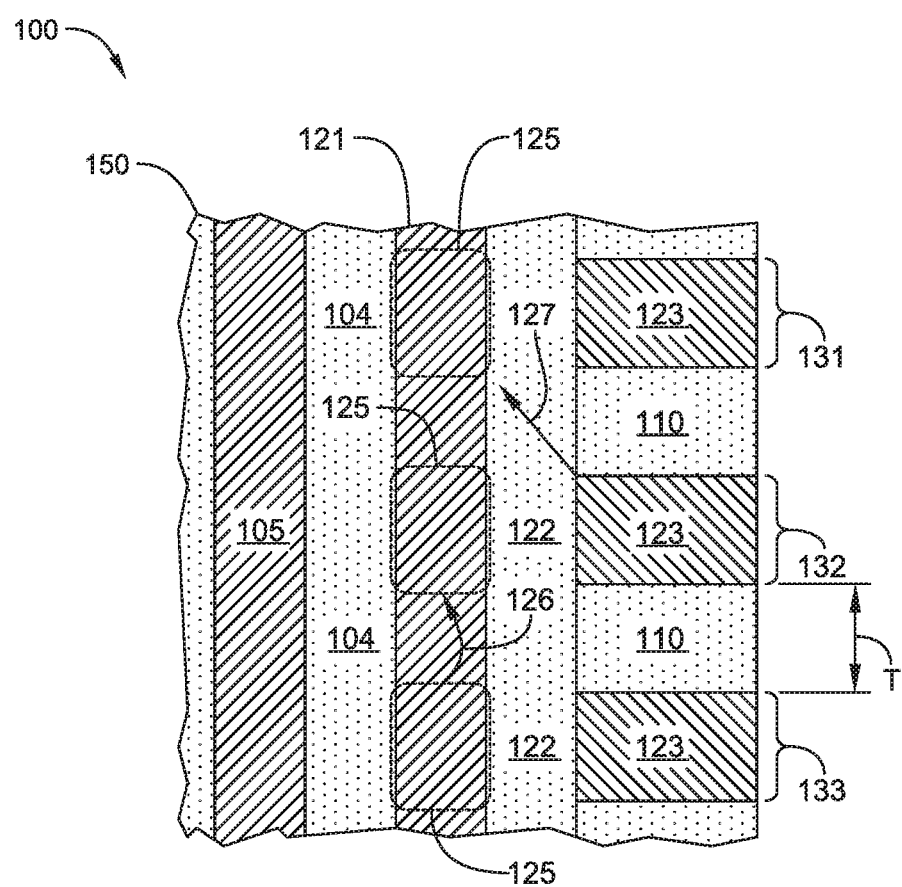
FIG. 1 is a schematic cross-sectional view of a portion of a conventional three-dimensional (3D) NAND memory device.

In a conventional three-dimensional (3D) NAND memory device, the charge storage region of a memory cell may be susceptible to leakage of trapped charge into or out of the charge storage region of adjacent memory cells, compromising stored data, as illustrated in FIG. 1. FIG. 1 is a schematic cross-sectional view of a portion 150 of a conventional three-dimensional (3D) NAND memory device 100. Portion 150 includes memory cells 131, 132, and 133, each separated by insulator layers 110, such as silicon dioxide layers. Each of memory cells 131-133 includes a separate control gate 123 for programming the associated memory cell. By contrast, a single blocking gate oxide layer 104 forms the gate oxide for each of memory cells 131-133, a single charge trap layer 121 provides the charge trap region 125 for each of memory cells 131-133, and a single blocking oxide layer 122 is generally disposed between control gates 123 and charge trap layer 121.

At a positive gate bias, electrons can tunnel from channel layer 105 through ultra-thin gate oxide layer 104 to charge trap layer 121, and are subsequently trapped. Silicon nitride ($Si_3N_4$), for example, has an intrinsic property of trapping charge (electrons or holes). As thickness T of insulator layers 110 is reduced in thickness, charge trapped in the charge trap region 125 of one memory cell can leak into the charge trap region of an adjacent memory cell, for example via electron hopping 126. For example, when thickness T is less than about 15-20 nm, electron hopping 126 can occur. In addition, the relatively sharp corners of control gates 123 can produce fringing effects 127 that can also affect charge trapped in the charge trap region 125 of adjacent memory cells.

Embodiments described herein generally relate to 3D NAND memory devices with improved word-line isolation and methods of forming the same. Specifically, for each memory cell of a vertical NAND string, the charge trap region, which serves as the charge storage region of each memory cell, is formed as a separate charge-trap "island." As a result, the charge-trap region of one memory cell is electrically isolated from adjacent charge-trap regions in adjacent memory cells. Thus, a single charge-trap layer that is adjacent to all memory cells in the vertical NAND string is not present. In some embodiments, the charge trap region of one memory cell is separated from the charge trap regions of adjacent memory cells by a dielectric structure, such as a silicon oxide film. In other embodiments, the charge trap region of a memory cell is separated from the charge trap regions of adjacent memory cells by an air, gas, or vacuum-containing spatial gap.

Figure 2:
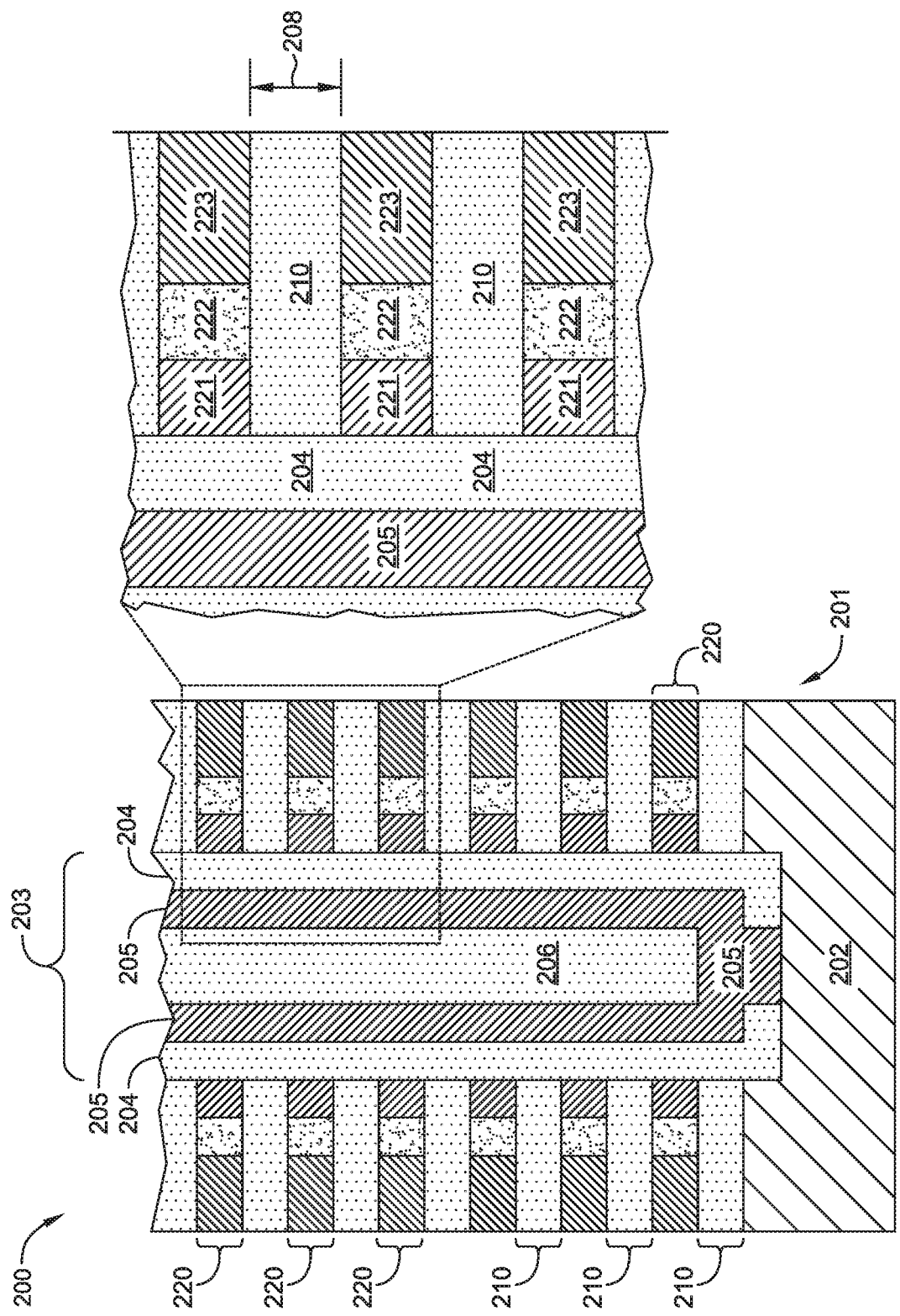
FIG. 2 shows a schematic cross-sectional view of a portion of a 3D NAND memory device, according to an embodiment of the disclosure.

FIG. 2 shows a schematic cross-sectional view of a portion of a 3D NAND memory device 200, according to an embodiment of the disclosure. 3D NAND memory device 200 includes a string 201 of vertically stacked memory cells formed on a semiconductor substrate 202. String 201 includes a plurality of memory cells 220 alternately disposed between a plurality of insulator layers 210. As shown, insulator layers 210 and memory cells 220 are formed around a memory hole 203, in which a gate oxide layer 204, a polysilicon channel 205, and a filler material 206 are disposed.

String 201 further includes a select gate coupled to a source line (not shown) and a select gate coupled to a bit line (not shown) that are each separately coupled to control gates 223 within the various memory cells 220. In the embodiment illustrated in FIG. 2, string 201 is configured as a single vertical structure, but in other embodiments, string 201 may be configured as a U-shaped structure with two vertical columns. "Top," "up," and "upward" are used herein to describe elements or directions perpendicularly distal from the plane of semiconductor substrate 202 and the center of mass of semiconductor substrate 202. Similarly, "vertical" is used to describe elements or directions aligned in the "upward" direction, i.e., towards the "top".

Semiconductor substrate 202 may be any suitable starting material for forming integrated circuits, such as a silicon (Si) wafer or a germanium (Ge) substrate. In one example, semiconductor substrate 202 is a silicon semiconductor substrate having a layer or layers formed thereon, such as a film stack, employed to form a structure on semiconductor substrate 202, such as 3D NAND memory device 200. Semiconductor substrate 202 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. Semiconductor substrate 202 may be configured as a 200 mm, 300 mm, or 450 mm diameter substrate, or as a rectangular or square panel.

Gate oxide layer 204 is configured as a gate oxide for each of memory cells 220, and includes a suitable dielectric material, such as silicon dioxide. Channel 205 is a conductive structure that provides electrons to the charge trap region (described below) of each memory cell 220. For example, in some embodiments, channel 205 includes a doped or undoped polycrystalline silicon material.

Isolator layers 210 are disposed between and electrically isolate memory cells 220. A thickness 208 of each of the isolator layers 210 is less than about 200 nm, for example, less than about 50 nm, such as between about 20 nm and about 30 nm or less. Implementation of the embodiments described herein enables utilization of thin isolator layers 210, which reduce the overall height of the string 201, while maintaining a quality of the oxide material used for the isolator layers 210. It is believed the isolator layers 210 and materials thereof described herein maintain an appreciable breakdown voltage of leakage current, even at reduced thicknesses. As utilized herein, "breakdown voltage of leakage current" is the minimum voltage that causes an insulator to become electrically conductive.

Isolator layers 210 may be any suitable electrically isolating material, such as a TEOS-formed silicon dioxide. In one example, the isolator layers 210 are formed from a high wet etch rate oxide material. As utilized herein, "high wet etch rate" is an etch rate of an oxide material (i.e. isolator layers 210) that is greater than an etch rate of another oxide material (i.e. gate oxide layer 204) utilized in the memory device 200. It is contemplated that the high wet etch rate oxide material has an etch selectivity of greater than about 10:1, such as about 100:1 or greater. For example, isolator layers 210 formed form a high wet etch rate material would be removed at a rate of between about 10 times and about 100 times or more faster than a removal rate of the gate oxide layer 204. In certain embodiments, an HF or dilute HF material is utilized as an etchant to remove the high wet etch rate material.

In one embodiment, the high wet etch rate material is a stressed oxide. For example, the stressed oxide material may exhibit a tensile stress, such as a stress of about 300 MPa or greater. The deposition parameters utilized to deposit the isolator layers 210 may be selected to influence the stress of the as deposited isolator layers 210. It is believed that the stressed oxide has a reduced density when compared to conventional oxides which advantageously increases the etch rate of the stressed oxide, thus aiding in preferential removal of the stressed oxide.

In another embodiment, the isolator layers 210 are formed from a doped oxide material. In one example, the isolator layers 210 are doped with boron. In another example, the isolator layers 210 are doped with phosphorous. In another example, the isolator layers 210 are doped with boron and phosphorous. In this example, the isolator layers 210 are formed from a borophosphosilicate glass material.

Each of memory cells 220 corresponds to a word line of 3D NAND memory device 200, each word line extending into the page to form additional memory cells of 3D NAND memory device 200 that are not visible. Thus, each memory cell 220 is configured to store one or more bits of data. As such, each memory cell 220 includes a charge trap region 221, a blocking oxide 222, and a control gate 223. Charge trap region 221 is the charge storage region of a memory cell 220. According to embodiments of the disclosure, each charge trap region 221 is formed from a portion of a charge trap layer, such as a silicon nitride ($Si_3N_4$) layer, that is ultimately separated into individual "charge trap islands," one for each memory cell 220, as described below.

Blocking oxide 222 includes a material that prevents or reduces diffusion of metal atoms from control gate 223 into gate oxide 204 and isolates the control gate 223 from the charge trap region 221. Control gate 223 includes a conductive material and is configured to enable a particular voltage to be applied proximate charge trap region 221 when programming the memory cell 220.

Because each charge trap region 221 is physically separated from the charge trap region 221 of adjacent memory cells, electron hopping can no longer occur, even when the thickness of insulator layers 210 is less than about 200 nm. In addition, because insulator layers 210 extend between charge trap regions 221 of adjacent memory cells 220, charge trap regions 221 are electrically shielded from fringing effects caused by the relatively sharp corners of control gates 223.

According to various embodiments, a novel charge-trap region may be formed via a "gate-last" fabrication process, in which the gate structure for each memory cell in a 3D NAND device is formed after substantially all other elements of the memory cell have been formed. Alternatively, the novel charge-trap layer may be formed via a "gate-first" fabrication process, in which at least a portion of the gate structure for each memory cell is formed from conductive material originally deposited between the insulator layers of the memory cell string.

Figure 3:
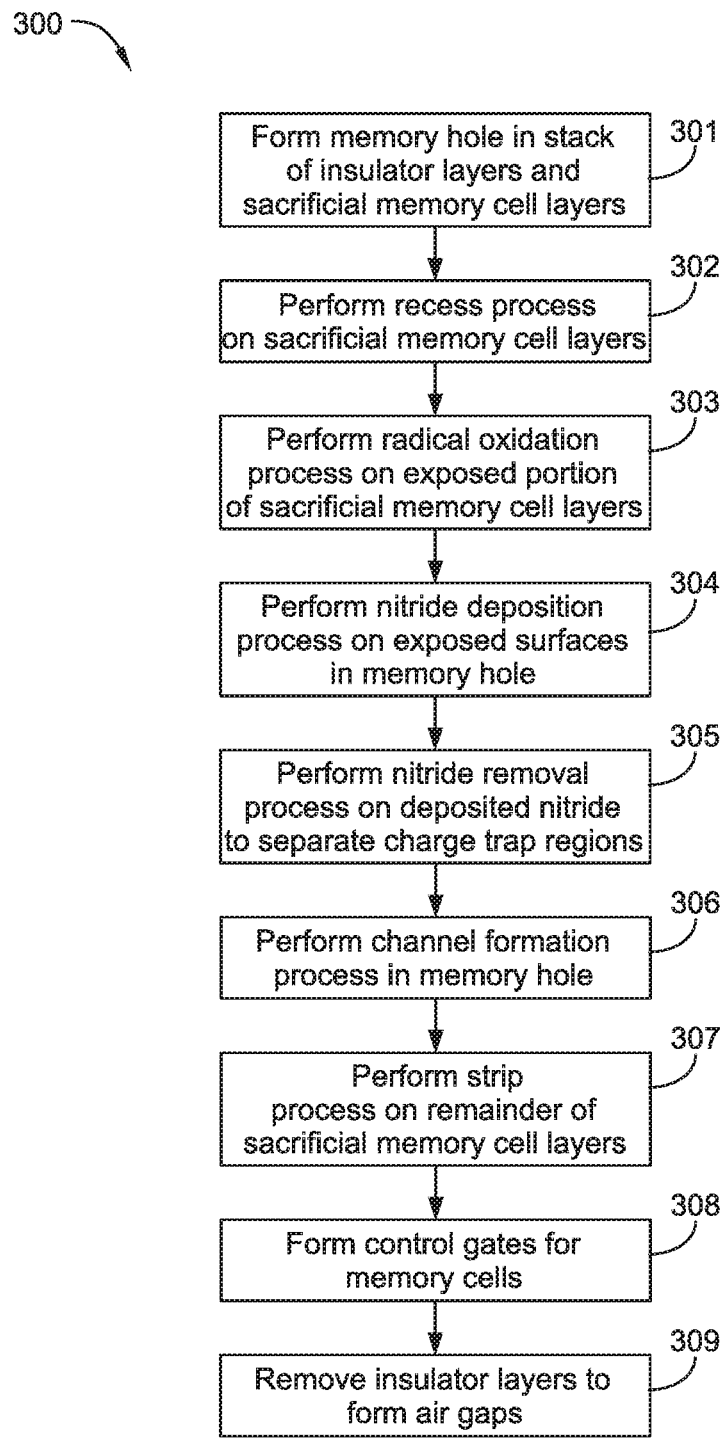
FIG. 3 is a flow chart of process operations for forming memory cells in a 3D NAND memory device, according to various embodiments of the disclosure.

FIG. 3 is a flow chart of process operations for forming memory cells in a 3D NAND memory device, according to various embodiments of the disclosure. FIGS. 4A-4I are schematic cross-sectional views of 3D NAND memory device 200 corresponding to different stages of the process of FIG. 3, according to various embodiments of the disclosure.

Figure 4A:
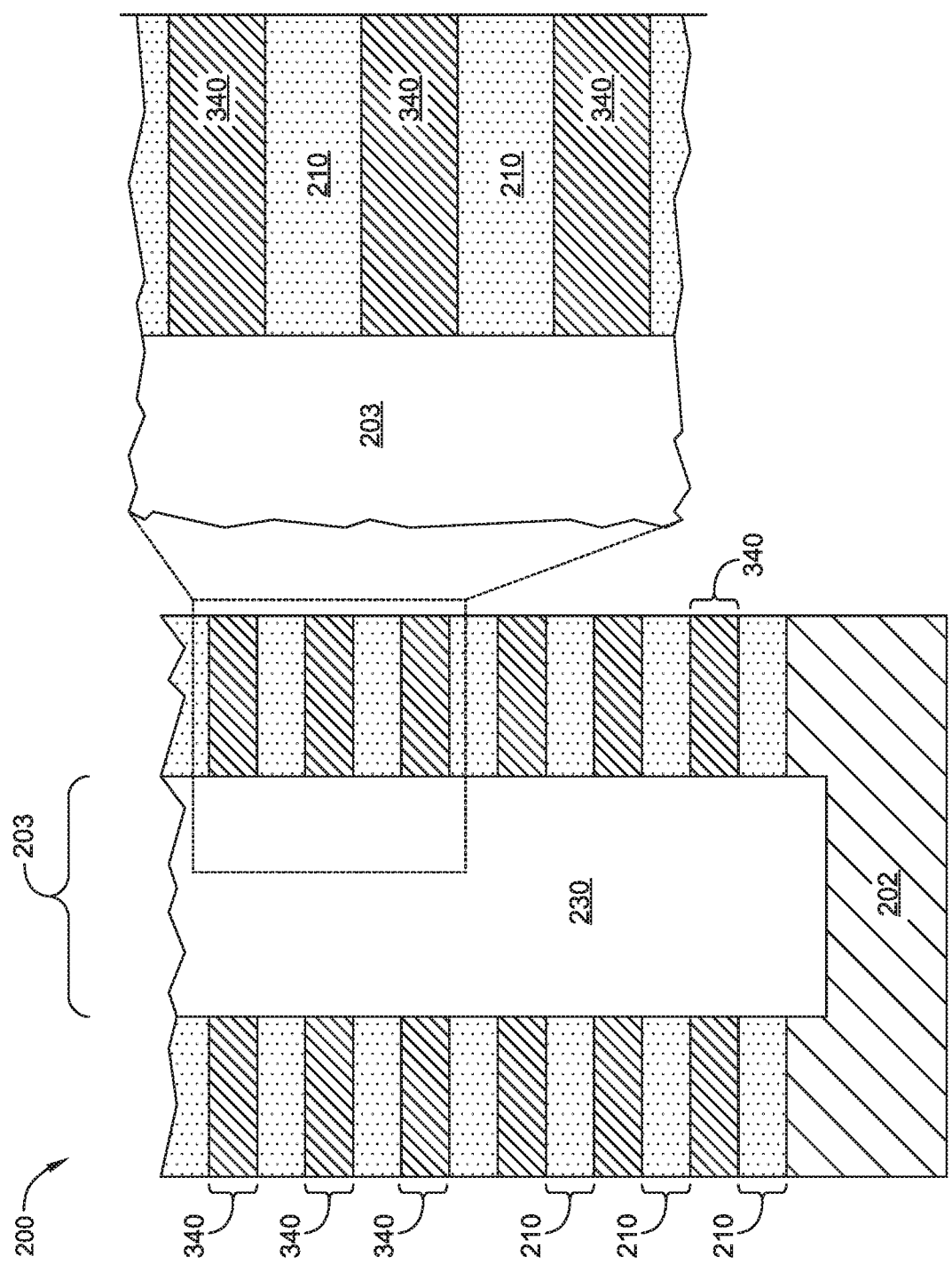
FIGS. 4A-4I are schematic cross-sectional views of the 3D NAND memory device of FIG. 2 corresponding to different stages of the process of FIG. 3, according to various embodiments of the disclosure.

Method 300 begins at operation 301, in which memory hole 203 is formed in a stack of alternating insulator layers 210 and sacrificial memory cell layers 340 deposited on semiconductor substrate 202, as shown in FIG. 4A. Any suitable etching method may be employed to form memory hole 203, such as deep reactive-ion etching (DRIE), a highly anisotropic etch process employed to create high aspect-ratio holes and trenches in semiconductor wafers or other substrates.

In some embodiments, sacrificial memory cell layers 340 are $Si_3N_4$ layers. In other embodiments, the sacrificial memory cell layers 340 are polysilicon layers. In one embodiment, if the sacrificial memory cell layers 340 are a polysilicon material, the sacrificial memory cell layers 340 are doped with arsenic. For example, the sacrificial memory cell layers 340 may be formed by a PECVD process in which an in-situ arsenic doping process utilizing an arsenic containing precursor, such as $AsH_3$, is performed. It is believed that diffusion of the arsenic within the lattice structure of the polysilicon material of the sacrificial memory cell layers 340 is reduced upon subsequent high temperature processing resulting in an advantageous reduction of the dopant at interfaces between the sacrificial memory cell layers 340 and the insulator layers 210.

In another embodiment, the sacrificial memory cell layers 340 are formed form an oxide material, such as a high wet etch rate oxide material, for example, a doped oxide such as borophosphosilicate glass. Other high wet etch rate oxide materials include oxides having a dielectric constant of less than about 3.0, for example, porous carbon doped silicon oxide materials. In this embodiment, the isolator layers 210 are formed from a silicon dioxide material. It is believed that by utilizing a high wet etch rate oxide material and a silicon dioxide material for the sacrificial memory cell layers 340 and the isolator layers 210, respectively, sufficient etch selectivity is achieved to enable selective removal of the sacrificial memory cell layers 340 during subsequent recess and/or stripping processes. In one example, HF or dilute HF etch chemistries are utilized for performing the recess and/or stripping processes.

Figure 4B:
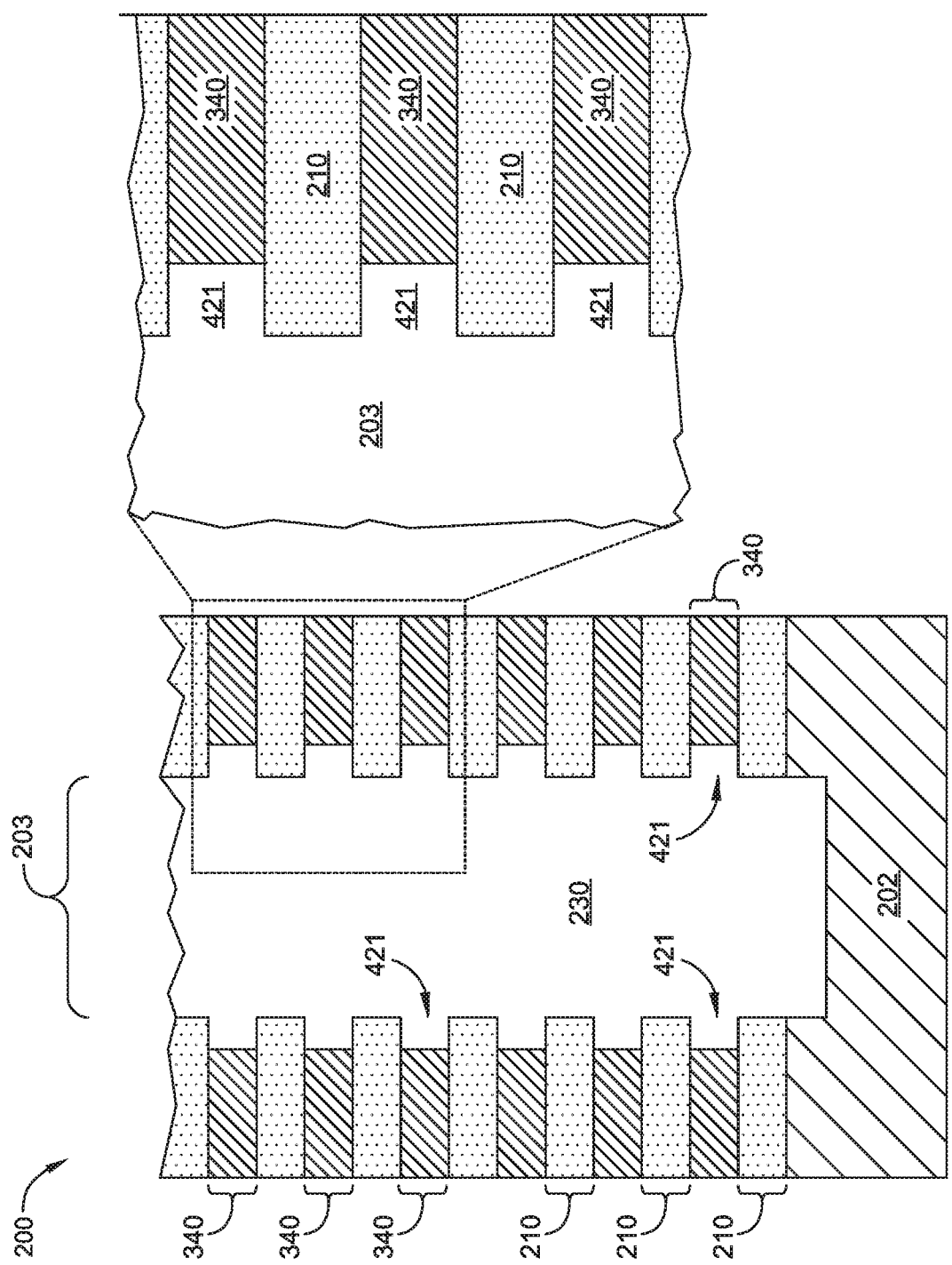

In operation 302, a recess process is performed to remove an exposed portion of sacrificial memory cell layers 340, as shown in FIG. 4B. The recess process of operation 302 is performed on edge surfaces of insulator layers 210 and sacrificial memory cell layers 340 that are exposed to memory hole 203. Generally, any isotropic etch process that is selective to at least the material of insulator layers 210 may be employed in operation 302 to remove a portion of sacrificial memory cell layers 340 with high selectivity.

For example, in some embodiments, a portion of sacrificial memory cell layers 340 is removed with a reactive species that is formed via a remote plasma from a process gas comprising oxygen ($O_2$) and nitrogen trifluoride ($NF_3$). More specifically, a fluorine-containing precursor and, in some embodiments, an oxygen-containing precursor are flowed into a remote plasma region while striking a plasma to form plasma effluents that then flow through a showerhead into a substrate processing region housing semiconductor substrate 202. Generally, selective etching processes that may be used for the removal of the sacrificial memory cell layers 340 are selected depending on the material of the sacrificial memory cell layers 340. For example, wet or dry etch chemistries are selected in response to, in various embodiments, silicon nitride sacrificial memory cell layers, polysilicon sacrificial memory cell layers, or high wet etch rate oxide material sacrificial memory cell layers.

In one example of a dry etching process, a flow of nitrogen trifluoride and oxygen ($O_2$) is introduced into a remote plasma region separate from and fluidly coupled to a substrate processing region, where the nitrogen trifluoride is excited in a remote plasma struck within the remote plasma region. More generally, a fluorine-containing precursor and an oxygen-containing precursor may be flowed into the remote plasma region. The fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride and xenon difluoride in embodiments. The oxygen-containing precursor may be one of atomic oxygen, molecular oxygen ($O_2$), ozone ($O_3$), nitrogen dioxide or nitrous oxide, including combinations thereof. Plasma effluents are formed and passed into the substrate processing region housing semiconductor substrate 202, thus removing a portion of sacrificial memory cell layers 340, as shown in FIG. 3B. The plasmas described herein may include one or more relatively inert gases, such as He, $N_2$, Ar, that can be used to improve plasma stability or process uniformity. Flow rates and ratios of the different gases may be used to control etch rates and etch selectivity.

In embodiments described herein, the fluorine-containing gas (e.g., $NF_3$) is supplied at a flow rate of between about 5 sccm (standard cubic centimeters per minute) and 400 sccm, helium at a flow rate of between about 0 slm (standard liters per minute) and 3 slm, and $N_2$ at a flow rate of between about 0 slm and 3 slm. One of ordinary skill in the art would recognize that other gases and/or flows may be used depending on a number of factors, including processing chamber configuration, substrate size and geometry, and layout of features being etched.

In addition to the other embodiments described herein, the pressure in the remote plasma region and/or the substrate processing region during all selective etch processes may be between about 0.01 Torr and about 30 Torr or between about 1 Torr and about 5 Torr in embodiments. In embodiments, an ion suppressor (which may be a showerhead) may be used to provide radical and/or neutral species for gas-phase etching. The ion suppressor may also be referred to as an ion suppression element. In embodiments, for example, the ion suppressor is used to filter etching plasma effluents (including radical-fluorine) en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate.

Generally, the quantity of sacrificial memory cell layer material removed in operation 302 is sufficient for the subsequent formation of the isolated charge trap regions 221, shown in FIG. 2. Thus, cavities 421 formed between insulator layers 210 in operation 302 have substantially the same size as the subsequently formed charge trap regions 221.

The recessing process of operation 302 may be performed in a suitable etch chamber that is configured to selectively remove a portion of sacrificial memory cell layers 340, such as the Selectra™ process chamber, available from Applied Materials, Inc. of Santa Clara, Calif., and the like. In particular, an etch chamber configured with a dual channel showerhead enables an etching process that allows for separation of etchants outside of the processing region, thus providing limited interaction with chamber components and each other prior to being delivered into the processing region. The etch chamber employed in operation 302 may be a standalone chamber, or part of a cluster tool, such as one of the ENDURA® line of cluster tools, also available from Applied Materials, Inc. It is also contemplated that suitably configured process apparatus from other manufacturers may be used in accordance with the embodiments described herein.

Figure 4C:
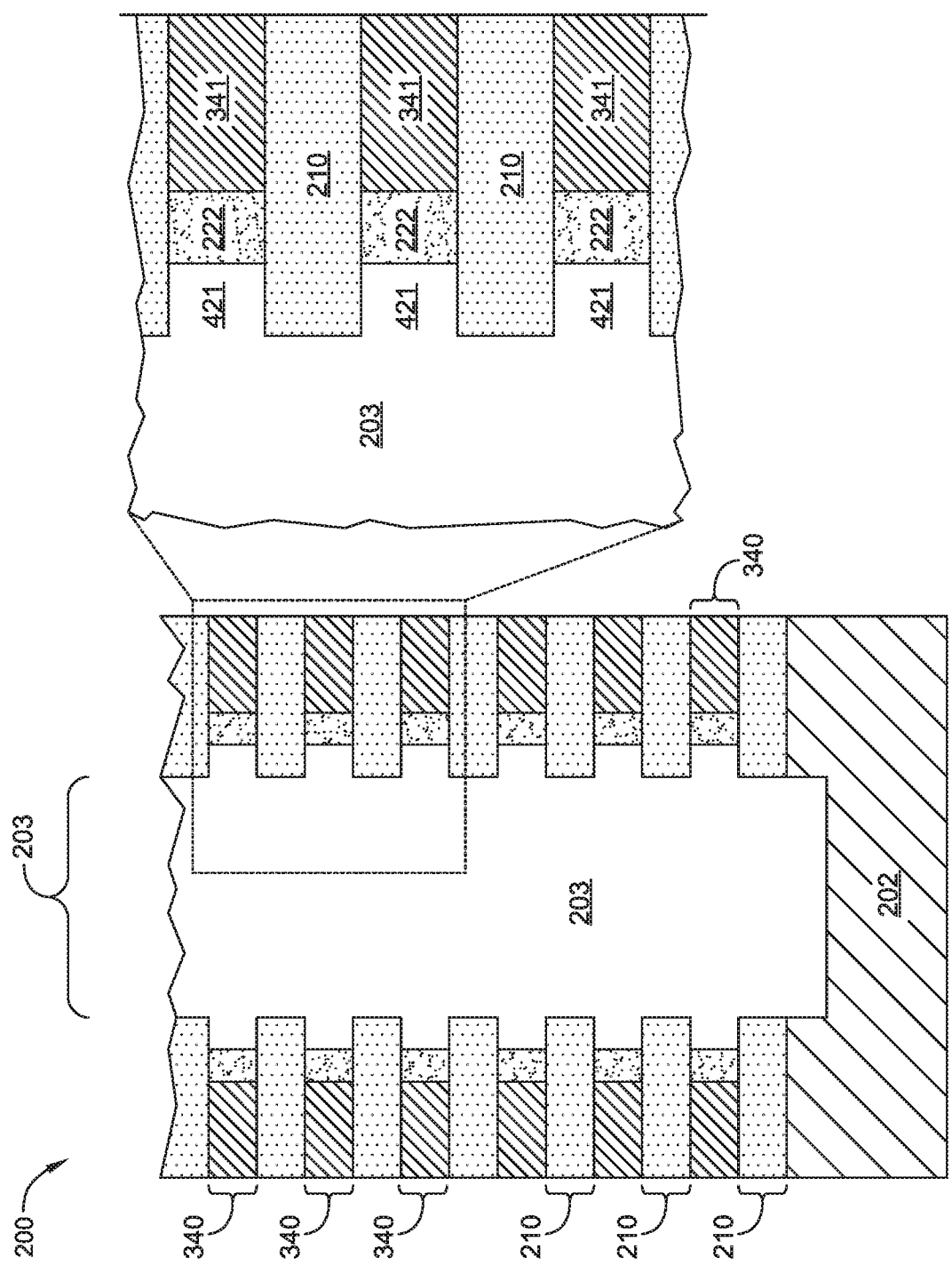

In operation 303, a radical oxidation process is performed to form blocking oxides 222 by oxidizing an exposed portion of sacrificial memory cell layers 340, as shown in FIG. 4C. Generally, any isotropic oxidation process suitable for uniformly oxidizing sacrificial memory cell layers 340 for each memory cell 220 of 3D NAND memory device 200 may be employed in operation 302. For example, a portion of sacrificial memory cell layers 340 is converted to blocking oxide 222 with a reactive species that is formed via a remote plasma.

Generally, the quantity of $Si_3N_4$ or polysilicon converted to blocking oxide 222 is determined based on what thickness of blocking oxide 222 is suitable for the specific materials employed in memory cells 220 and the process temperatures employed in forming the same. Upon completion of operation 303, a portion of sacrificial memory cell layers 340 is converted to blocking oxide 222 and a remainder portion 341 of sacrificial memory cell layers 340 remains disposed between insulator layers 210.

The radical oxidation process of operation 303 may be performed in any suitable deposition chamber, such as the Decoupled Plasma Oxidation (DPO) reactors available from Applied Materials, Inc., of Santa Clara, Calif., or the like. The deposition chamber employed in operation 302 may be a standalone chamber, or part of a cluster tool, such as one of a Gate Stack CENTURA®, available from Applied Materials, Inc., of Santa Clara, Calif. It is contemplated that other suitably configured reactors and/or cluster tools from other manufacturers may be advantageously utilized in accordance with the embodiments described herein.

Figure 4D:
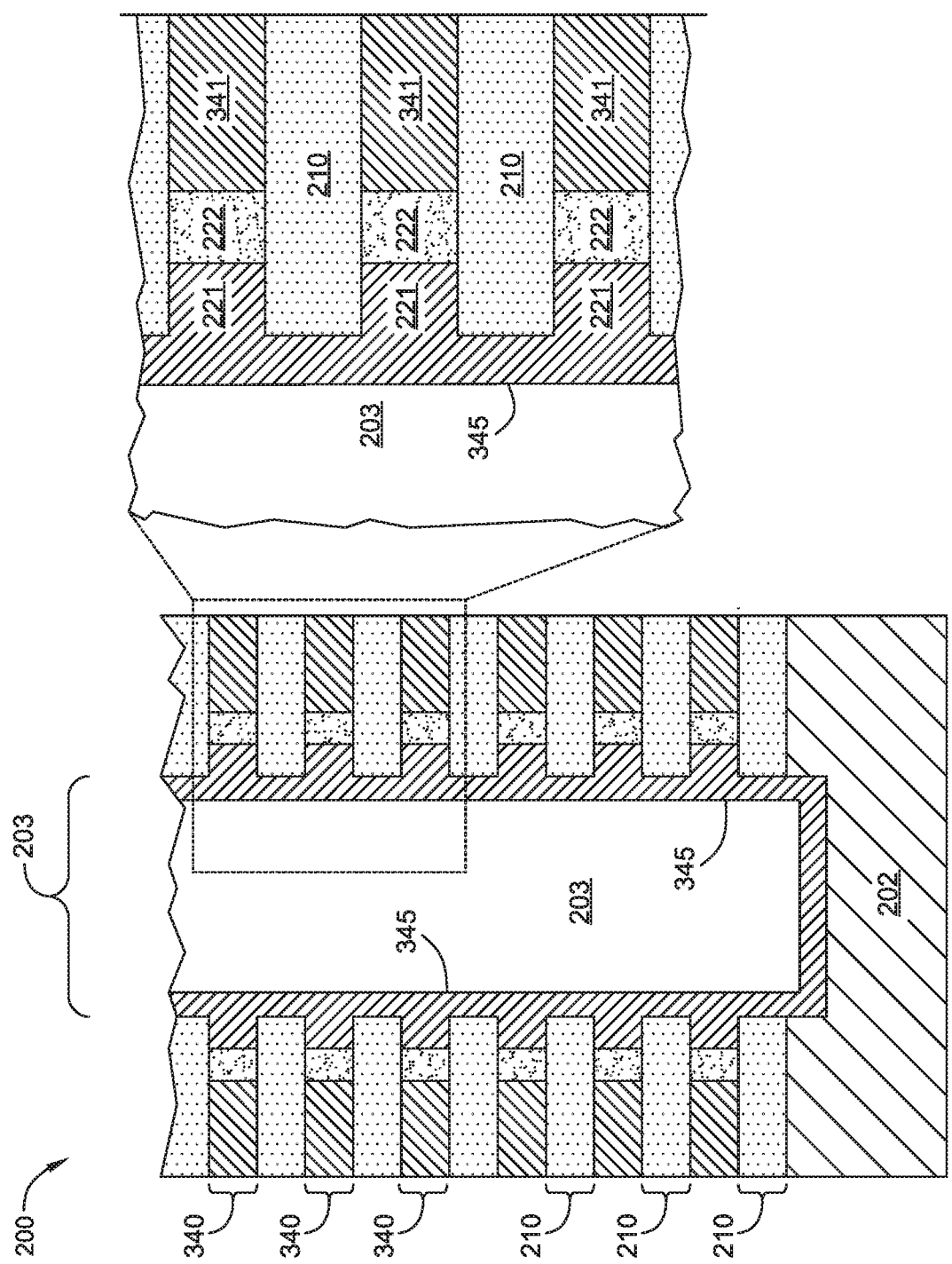

In operation 304, a nitride deposition process is performed on exposed surfaces within memory hole 203 to form $Si_3N_4$ layer 345, as shown in FIG. 4D. Charge trap regions 221 of memory cells 220 are formed by this nitride deposition process when cavities 421 (shown in FIG. 4C) are filled with $Si_3N_4$ layer 345. Generally, any nitride deposition process suitable for filling cavities 421 in sacrificial memory cell layers 340 for each memory cell 220 may be employed in operation 304.

Figure 4E:
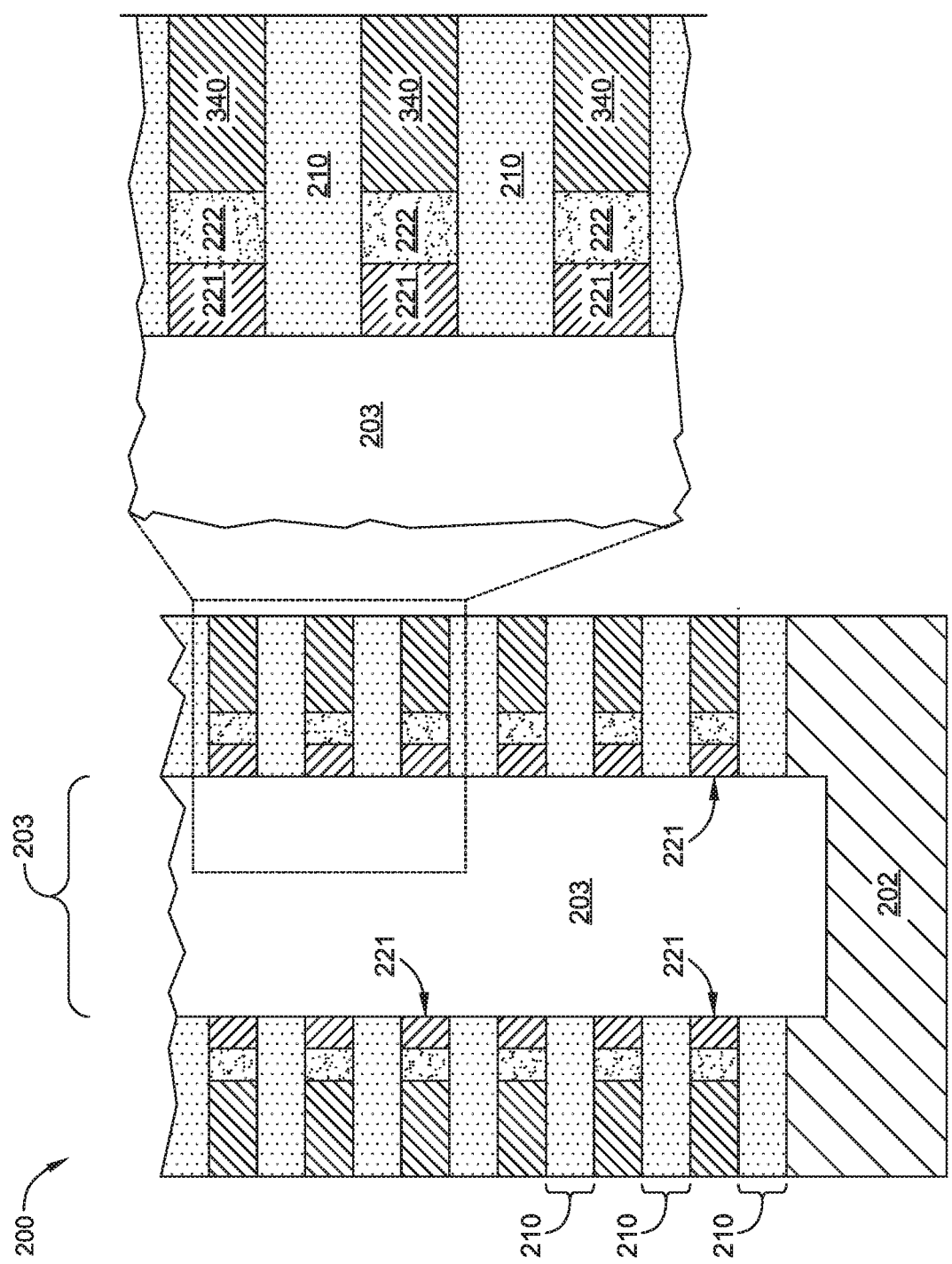

In operation 305, a nitride removal process is performed to remove a portion of $Si_3N_4$ layer 345 and form separate charge trap regions 221 from each other, as shown in FIG. 4E. In some embodiments, the nitride removal process of operation 305 may be substantially similar to the nitride etch process employed in operation 302. In some embodiments, the nitride etch process of operation 305 is modified with respect to the nitride etch process of operation 302 to have a significantly slower etch rate and provide finer thickness control. Upon completion of operation 305, charge trap regions 221 are physically and electrically separated from each other.

Figure 4F:
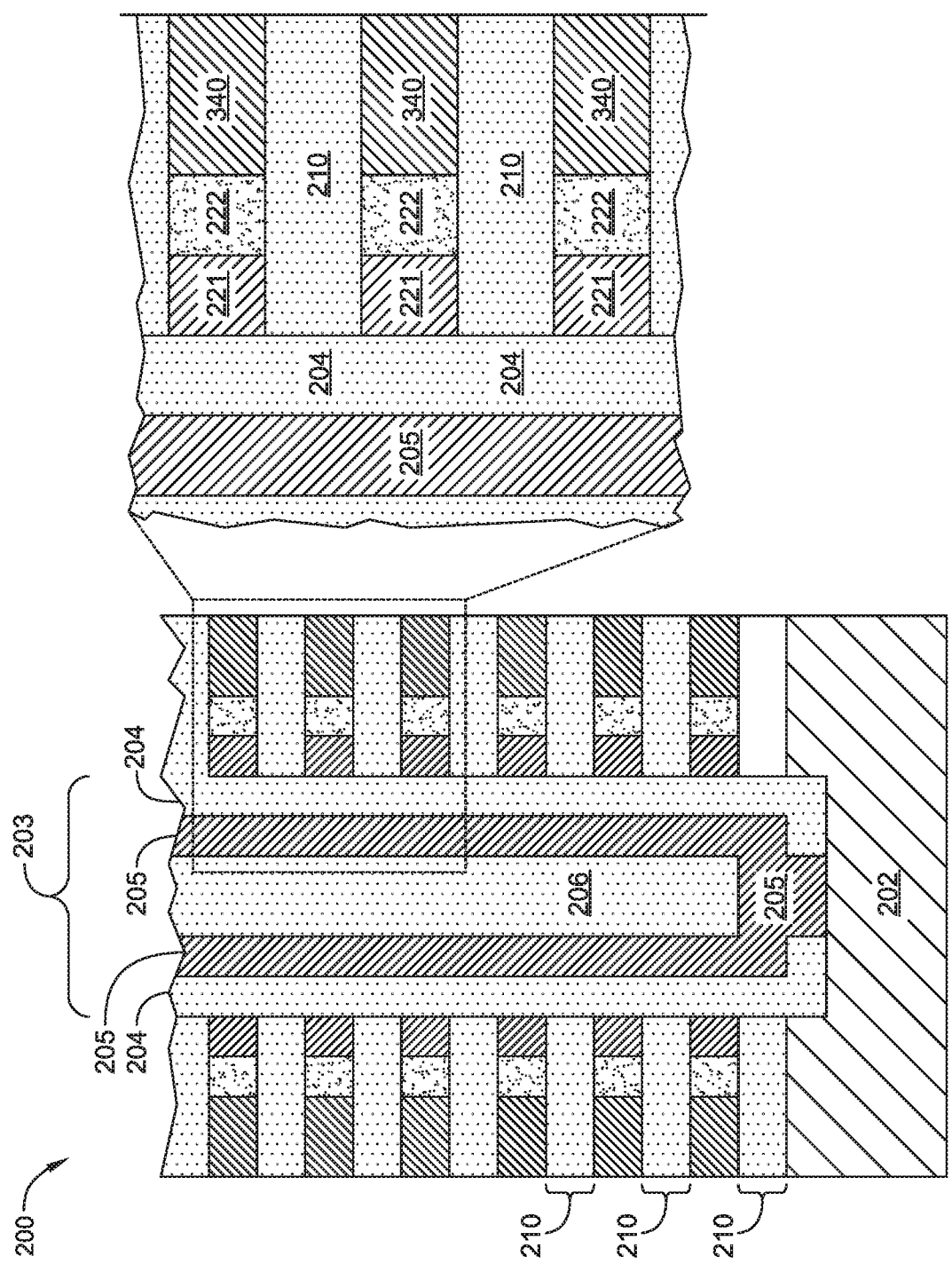

In operation 306, a channel formation process is performed on exposed surfaces in memory hole 203. Thus, in some embodiments, gate oxide layer 204 is deposited on exposed surfaces of charge trap regions 221 and insulator layers 210, polysilicon channel 205 is deposited on exposed surfaces of gate oxide layer 204, and a remainder of memory hole 203 is filled with filler material 206, as shown in FIG. 4F. It is contemplated that the gate oxide layer 204 is also etched to expose the underlying substrate 202 and the polysilicon channel 205 is deposited in contact with the substrate 202. Conventional oxide deposition techniques may be employed to form gate oxide layer 204 and filler material 206, and conventional polysilicon deposition techniques may be employed to form polysilicon channel 205. Etching of the gate oxide layer 204 to enable contact between the polysilicon channel 205 and the substrate 202 includes convention masking and etching techniques known in the art.

Figure 4G:
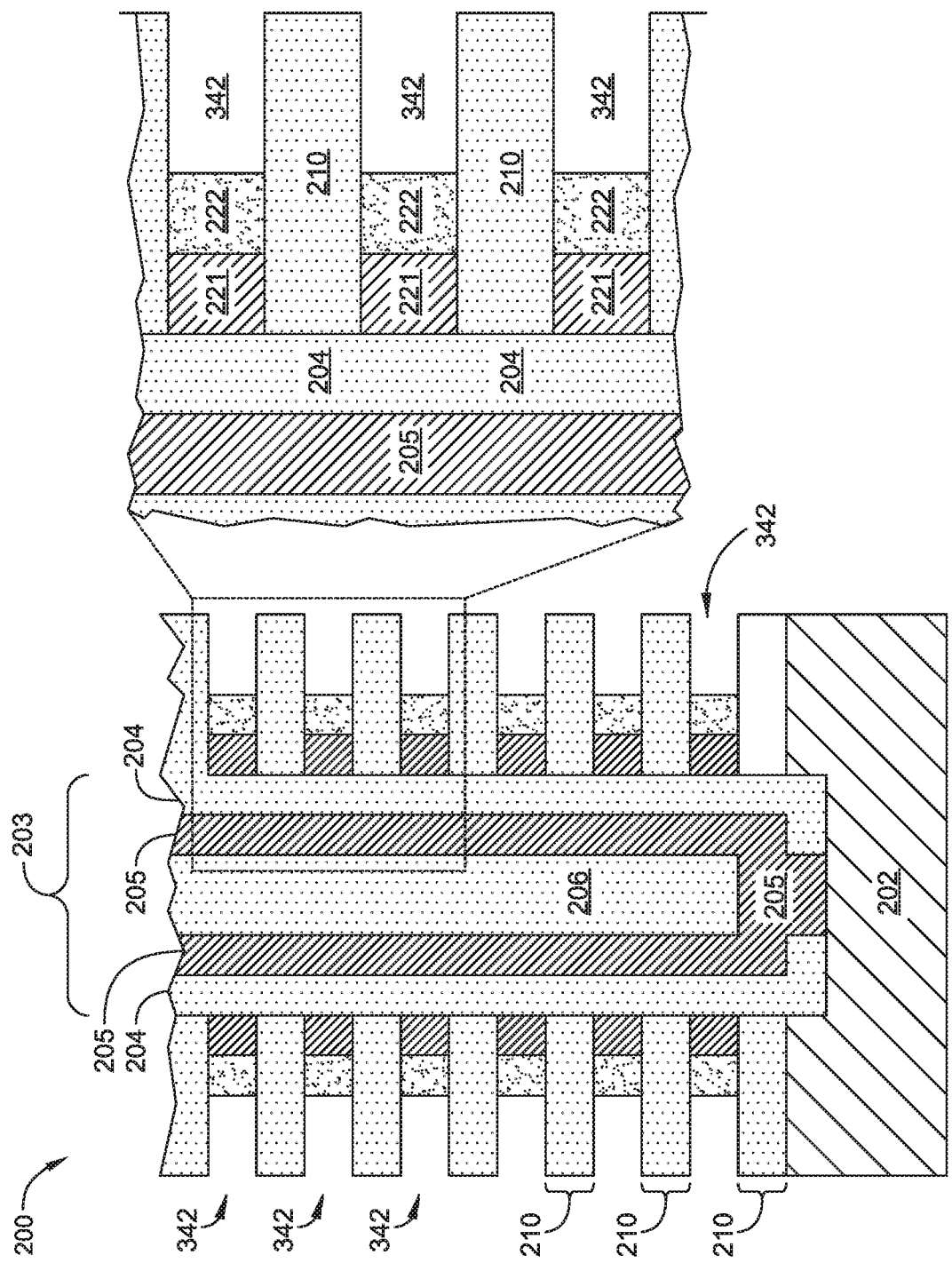

In operation 307, a nitride strip process is performed on remainder portions 341 of sacrificial memory cell layers 340, as shown in FIG. 4G. In some embodiments, the nitride removal process of operation 307 may be substantially similar to the nitride etch process employed in operation 302. Upon completion of operation 307, cavities 342 are formed between insulator layers 210. Cavities 342 are subsequently filled to form control gates 223 of memory cells 220.

Figure 4H:
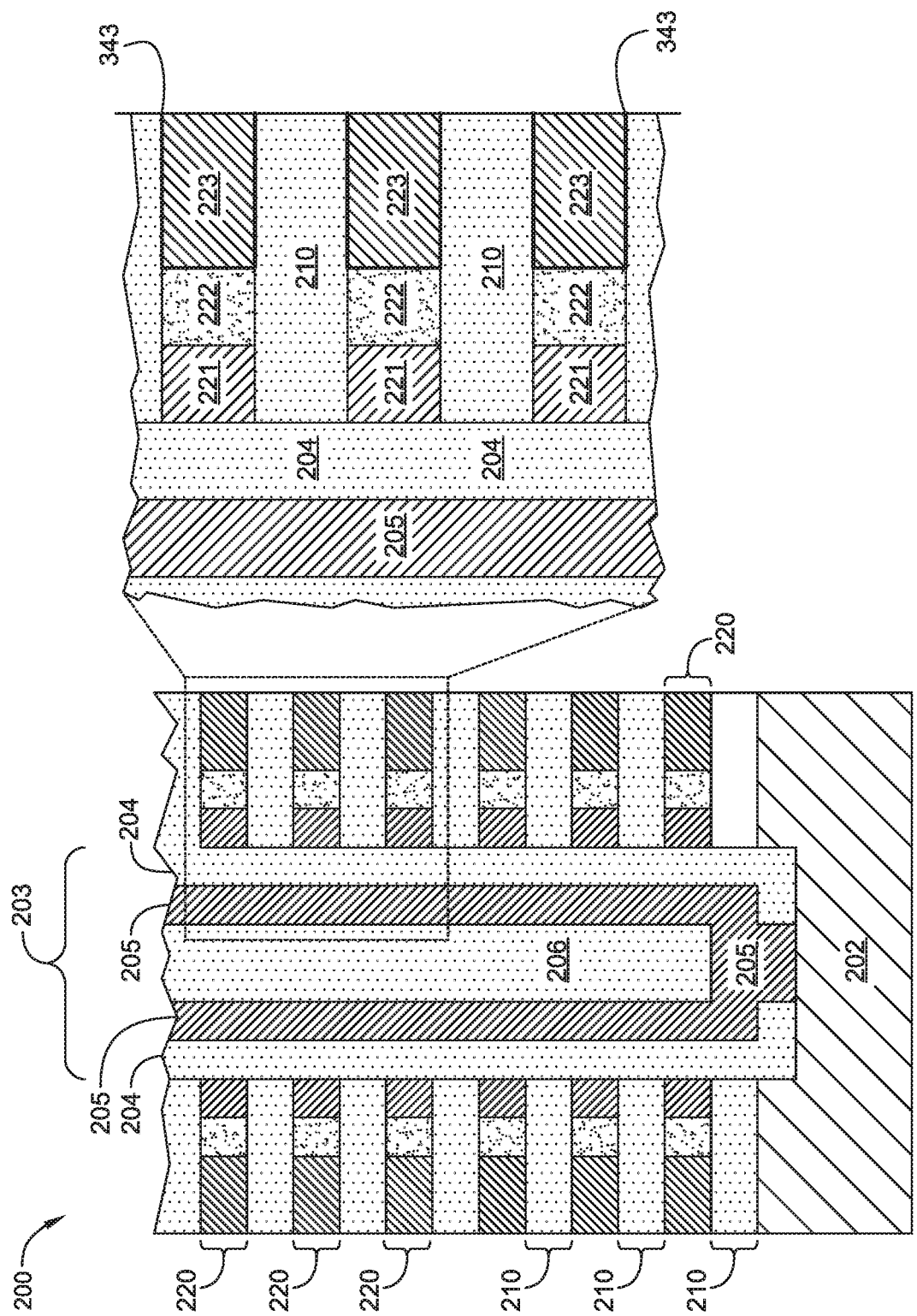

In operation 308, control gates 223 are formed via a gate formation process, as shown in FIG. 4H. In some embodiments, in operation 308 a high-k layer 343 is deposited on exposed surfaces of cavities 342 and insulator layers 210, control gates 223 are formed via a metal deposition process, for example via a chemical-vapor deposition (CVD) or atomic-layer deposition (ALD) process, and exposed portions of high-k layer 343 are etched from insulator layers 210. The high-k layer 343 may include an aluminum oxide ($AlO_x$), hafnium oxide ($HfO_x$) or other suitable high-k material. In addition, in some embodiments, an adhesion or barrier layer, such as a titanium nitride (TiN) or silicon nitride (SiN) layer (not shown for clarity) may be deposited in cavities 342 prior to the metal deposition process.

Upon completion of operation 308, the charge trap region 221 of each memory cell 220 is physically and electrically separated from the charge trap region of adjacent memory cells 220 by insulator layers 210. Thus, the charge trap regions 221 of memory cells 220 are not susceptible to electron hopping or other leakage, and the word lines of 3D NAND memory device 200 are electrically isolated from each other.

Figure 4I:
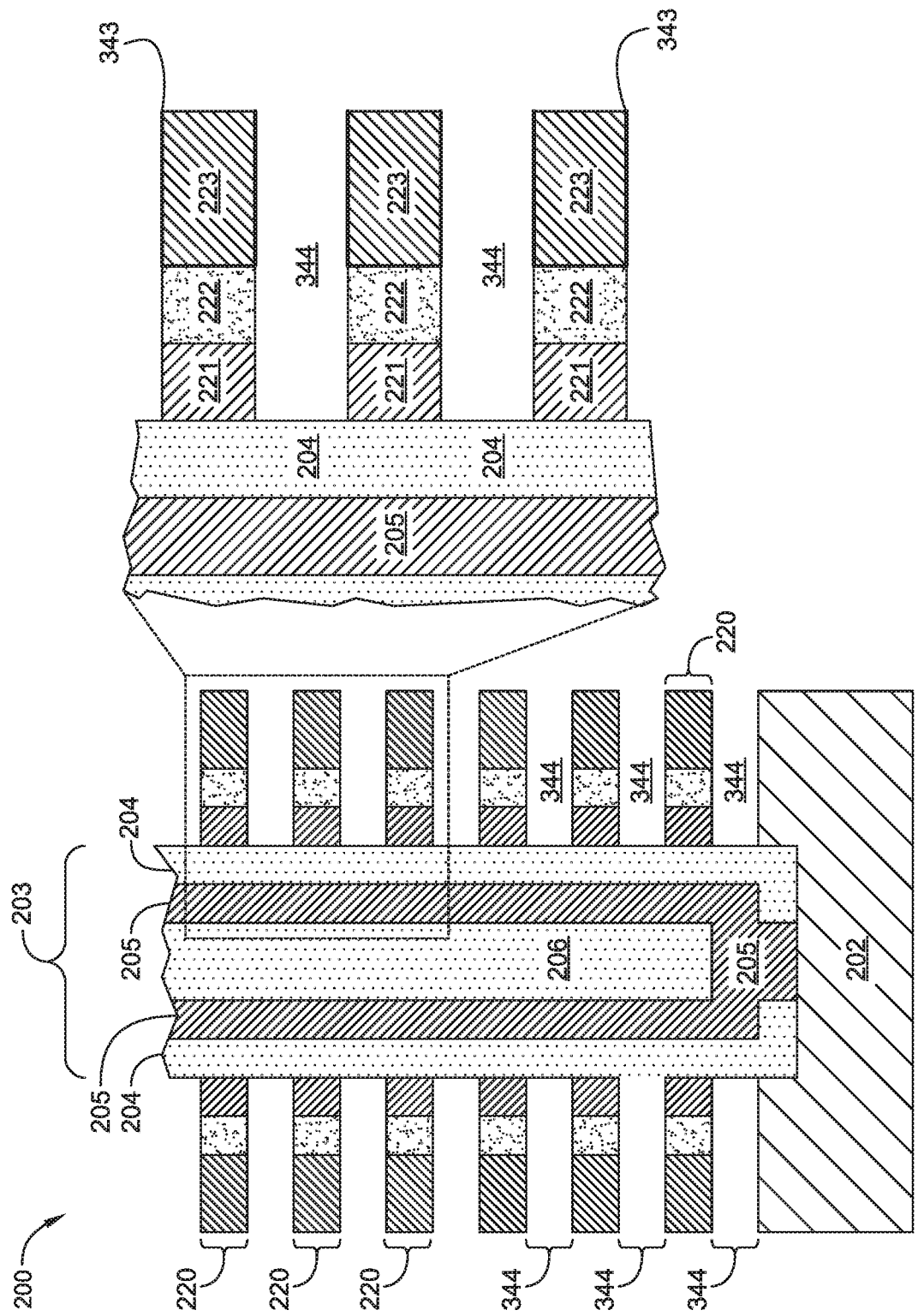

In operation 309, some or all of insulator layers 210 are removed, so that the charge trap region 221 of each memory cell 220 is separated from the charge trap region of adjacent memory cells 220 by an "air gap" 344, as illustrated in FIG. 4I. It is noted that the term "air gap" may also refer any other gas-filled gap and/or to a vacuum containing gap. As described above, the material of insulator layers 210 is selected to be suitable for use as a sacrificial oxide layer, and a suitable silicon oxide etch process can be employed in operation 309.

Figure 5A:
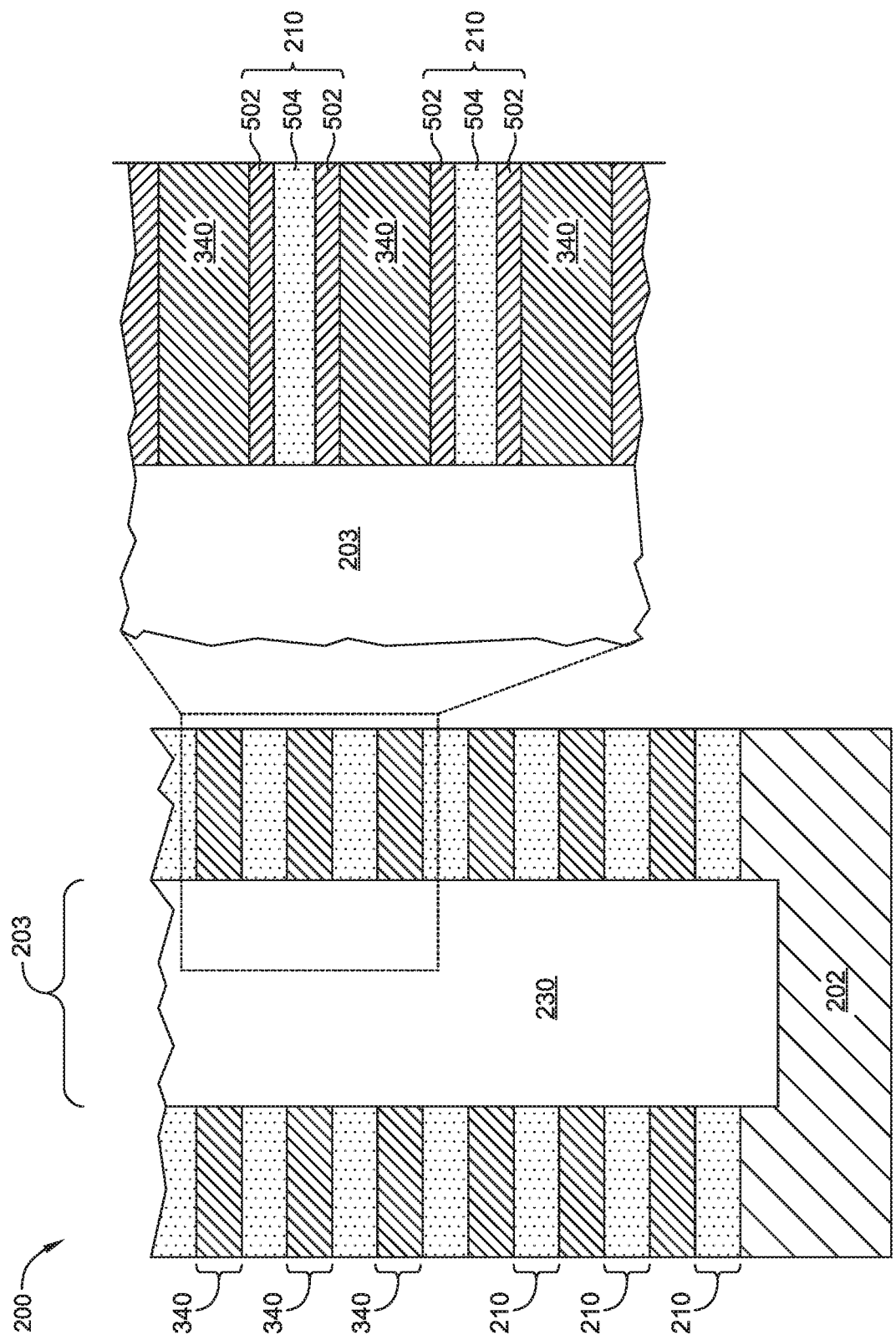
FIGS. 5A-5B are schematic cross-sectional views of the 3D NAND memory device of FIG. 2 corresponding to different stages of the process of FIG. 3, according to various embodiments of the disclosure.
Figure 5B:
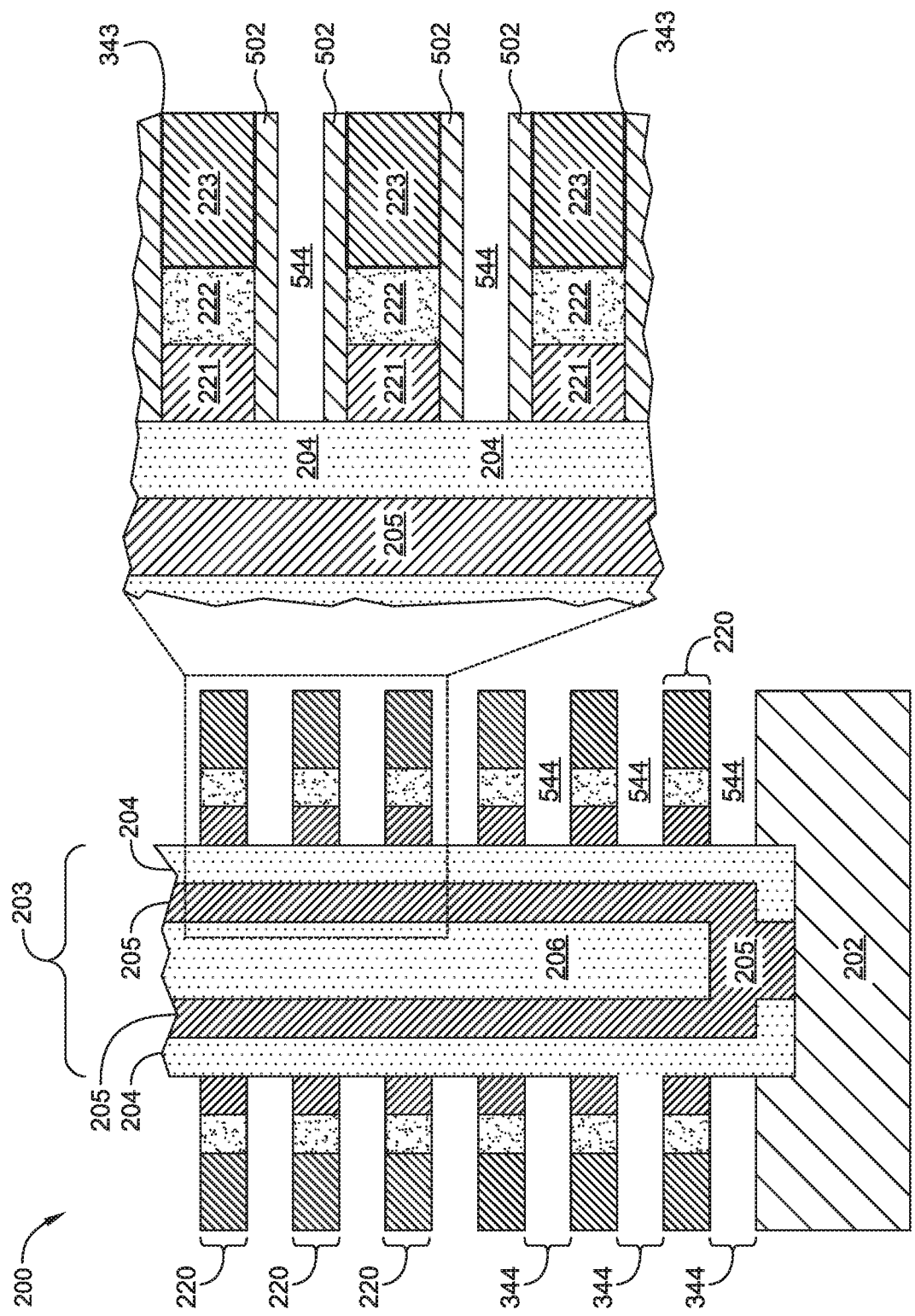

FIGS. 5A-5B are schematic cross-sectional views of the 3D NAND memory device 200 of FIG. 2 corresponding to different stages of the process of FIG. 3, according to various embodiments of the disclosure. More specifically, FIG. 5A corresponds to operation 301 of FIG. 3. In one embodiment, the isolator layers 210 include a first material layer 502 and a second material layer 504. The first material layer 502 is deposited on surfaces of adjacent sacrificial memory cell layers 340 and the second material layer 504 is disposed between two of the first material layers 502.

In one embodiment, the first material layer 502 is formed from an oxide material, such as silicon dioxide or the like. The second material layer 504 is formed from a high wet etch rate oxide material. In another embodiment, the first material layer 502 is formed from an oxide material and the second material layer 504 is formed from a nitride material, such as silicon nitride or the like. In this embodiment, the sacrificial memory cell layers 340 are formed from a polysilicon material. In both embodiments, the materials selected for each of the first material layer 502 and the second material layer 504 are sufficiently different to enable selective etching of the second material layer 504 relative to the first material layer 502.

The device 200 described with regard to FIG. 5A is processed in accordance with the operations of FIG. 3 illustrated in conjunction with FIGS. 4B-4H. FIG. 5B illustrates operation 309, where the second material layer 504 of the insulator layers 210 is removed, so that the charge trap region 221 of each memory cell 220 is separated from the charge trap region of adjacent memory cells 220 by an "air gap" 544. As illustrated, the first material layer 502 further defines the air gap 544. It is noted that the term "air gap" may also refer any other gas-filled gap and/or to a vacuum containing gap. As described above, the material of the second material layer 504 is selected to be suitable for use as a sacrificial oxide or nitride layer, depending upon the starting material utilized, and a suitable oxide etch process can be employed in operation 309 to remove the second material layer 504.

It is contemplated that advantages associated with both oxides and air gaps for insulator layers are realized as the first material layer 502 provides isolation of the memory cell 220 while also benefiting from the advantages of the air gap 544. It is believed that the air gap 544 enables the first material layer 502 to be relatively thin, such as having a thickness of about 10 nm or less, and of high oxide quality to reduce Rc delay.

Figure 6A:
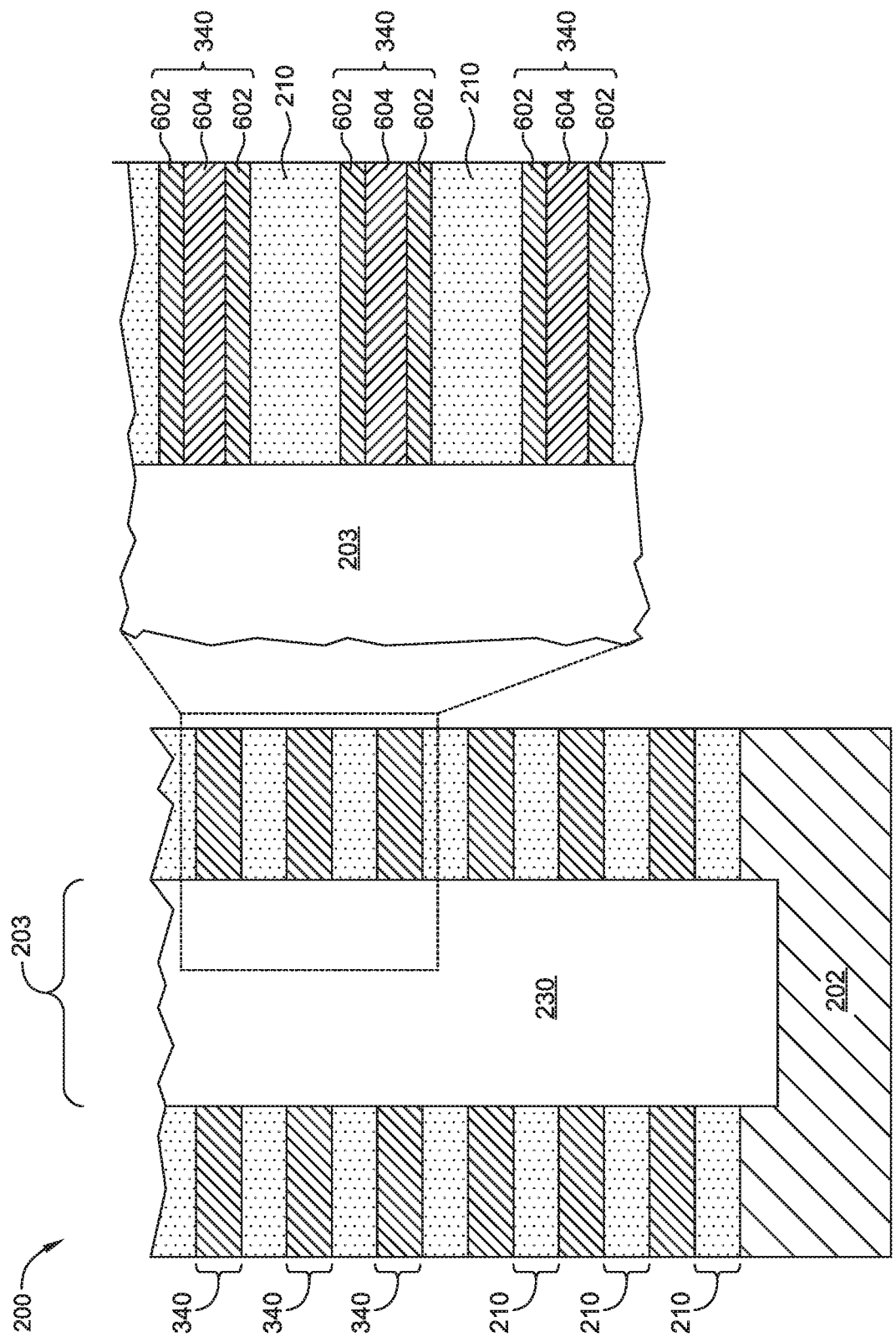
FIGS. 6A-6B are schematic cross-sectional views of the 3D NAND memory device of FIG. 2 corresponding to different stages of the process of FIG. 3, according to various embodiments of the disclosure.
Figure 6B:
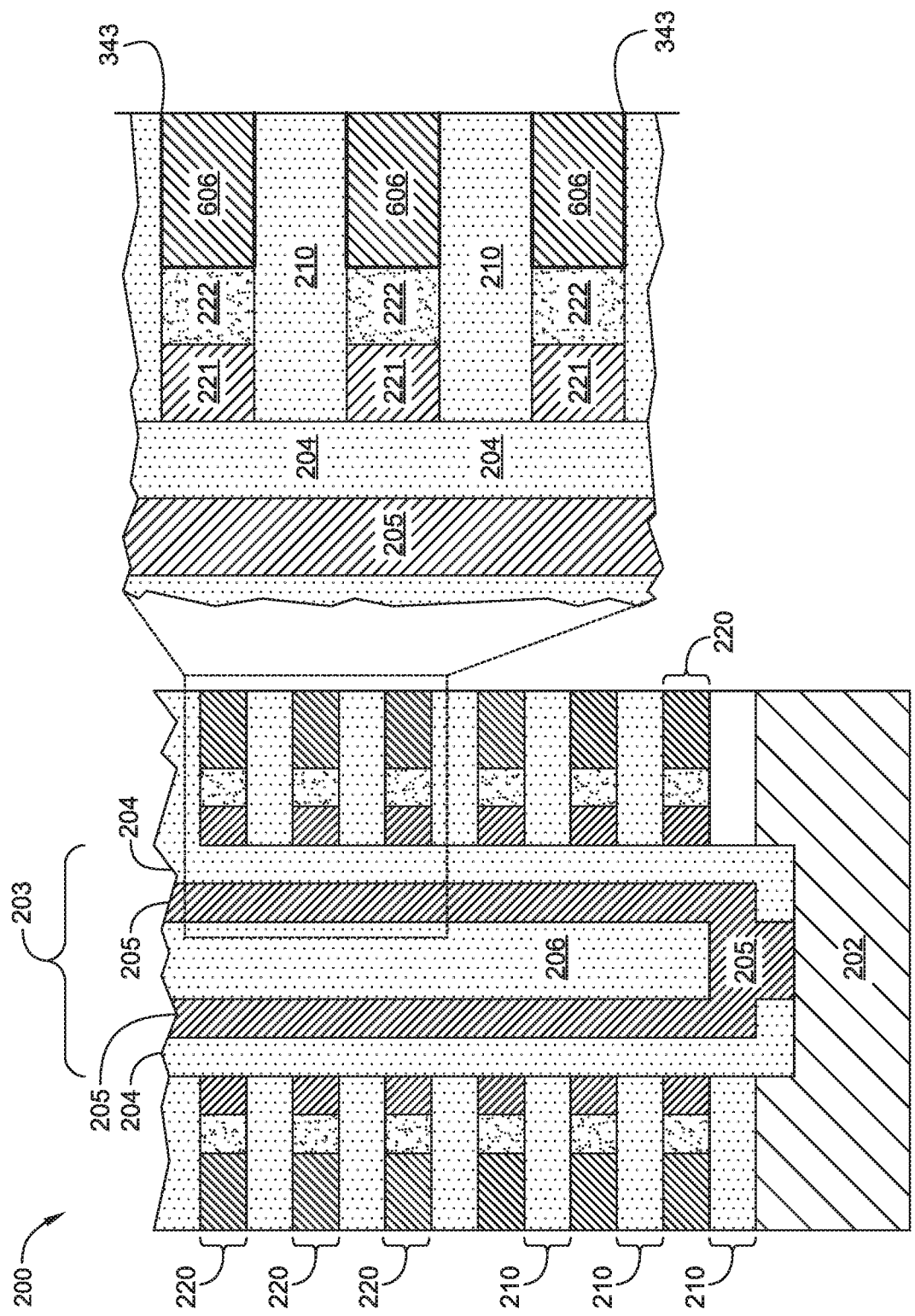

FIGS. 6A-6B are schematic cross-sectional views of the 3D NAND memory device 200 of FIG. 2 corresponding to different stages of the process of FIG. 3, according to various embodiments of the disclosure. More specifically, FIG. 6A corresponds to operation 301 of FIG. 3. In one embodiment, the sacrificial memory cell layers 340 include a first material layer 602 and a second material layer 604. The first material layer 602 is deposited on surfaces of adjacent isolator layers 210 and the second material layer 604 is disposed between two of the first material layers 602. A thickness of each of the first material layer 602 and the second material layer 604 is about 10 nm or less. In this embodiment, a thickness of the sacrificial memory cell layers 340 having the stacked first material layer 602 and second material layer 604 is about 30 nm or less.

In one embodiment, the first material layer 602 is formed from a silicon material, such as amorphous or polysilicon. The second material layer 504 is formed from a metallic material, such as tungsten materials, titanium material, nickel materials, and the like. A resulting silicon/metal/silicon stack is formed which comprises the sacrificial memory cell layers 340.

The device 200 described with regard to FIG. 6A is process in accordance with the operations of FIG. 3 illustrated in conjunction with FIGS. 4B-4F. In this embodiment, operation 307 is not performed and operation 308 is a high temperature anneal to form a silicide as the control gate 606. The high temperature anneal is performed at a temperature sufficient to cause the first material layer 602 and the second material layer 604 to form a metal silicide. In one embodiment, a temperature of the anneal is about 850° C. or greater. The anneal may be performed by a rapid thermal annealing process or the like.

It is contemplated that utilizing a silicide as the control gate may provide advantageous reductions in sheet resistance within the device 200 while improving efficiency of the device formation process. Operation 309, which forms an air gap, may also be implemented in embodiments utilizing a silicide material control gate 606.

As described herein, improved 3D NAND devices and methods of fabrication thereof are contemplated in accordance with the disclosed embodiments. By utilizing an air gap in the device structure, oxide thickness reduction is achieved without sacrificing material quality. In addition, embodiments described herein enable 3D NAND devices which exhibit reduced sheet resistance and Rc delay. Accordingly, improved 3D NAND device fabrication methods and device structures may be realized in accordance with implementation of the disclosed embodiments.

While the foregoing is directed to embodiments of the present disclosure, other and further embodiments of the disclosure may be devised without departing from the basic scope thereof, and the scope thereof is determined by the claims that follow.

What is claimed is:

1. A memory device fabrication method, comprising:
   forming a hole in a stack of alternating insulator layers and memory cell layers, wherein the insulator layers comprise a second oxide material layer disposed between a plurality of first oxide material layers;
   removing a first portion of each memory cell layer adjacent the hole to form a plurality of first cavities and expose an intermediate portion of the memory cell layers;
   performing a radical oxidation process on the intermediate portion of each memory cell layer to form blocking oxides;
   depositing a charge trap material in the plurality of first cavities and in contact with the blocking oxides;
   removing a second portion of each memory cell on a surface opposite the first portion of the memory cell layers to form a plurality of second cavities and expose the blocking oxide;
   forming a control gate within each of the second cavities; and
   removing the second oxide material layer after forming the control gate to form an air gap.

2. The method of claim 1, wherein depositing the charge trap material comprises:
   depositing the charge trap material on surfaces of the first cavities and on edge surfaces of the insulator layers; and
   removing a portion of the charge trap material from the edge surfaces of the insulator layers to electrically separate remaining charge trap material in each of the first cavities from the remaining charge trap material in adjacent first cavities.

3. The method of claim 2, wherein the removing the second oxide material layer comprises performing an isotropic etch process to expose surfaces of the first oxide material layers.

4. The method of claim 1, wherein the memory cell layers comprise a sacrificial layer.

5. The method of claim 4, wherein the sacrificial layer is selected from the group consisting of a polysilicon material, a silicon nitride material, and an oxide material.

6. The method of claim 5, wherein the sacrificial layer comprises an arsenic doped polysilicon material.

7. The method of claim 1, wherein the plurality of first oxide material layers comprise silicon dioxide.

8. The method of claim 7, wherein the second oxide material layer comprises a high wet etch rate oxide material.

9. The method of claim 8, wherein the high wet etch rate oxide material is selected from the group consisting of a tensile oxide material, a boron doped oxide material, a phosphorous doped oxide material, and a borophosphosilicate glass material.

10. The method of claim 1, wherein a thickness of each of the plurality of first oxide material layers and a thickness of the second oxide material layer is about 10 nm or less.

11. A memory device fabrication method, comprising:
    forming a hole in a stack of alternating insulator layers and memory cell layers, wherein the insulator layers comprise a nitride material layer disposed between a plurality of oxide material layers;
    removing a first portion of each memory cell layer adjacent the hole to form a plurality of first cavities and expose an intermediate portion of the memory cell layers;
    performing a radical oxidation process on the intermediate portion of each memory cell layer to form blocking oxides;
    depositing a charge trap material in the plurality of first cavities and in contact with the blocking oxides;
    removing a second portion of each memory cell on a surface opposite the first portion of the memory cell layers to form a plurality of second cavities and expose the blocking oxide;
    forming a control gate within each of the second cavities; and
    removing the nitride material layer after forming the control gate to form an air gap between the plurality of oxide material layers.

12. The method of claim 11, wherein depositing the charge trap material comprises:
    depositing the charge trap material on surfaces of the first cavities and on edge surfaces of the insulator layers; and
    removing a portion of the charge trap material from the edge surfaces of the insulator layers to electrically separate remaining charge trap material in each of the first cavities from the remaining charge trap material in adjacent first cavities.

13. The method of claim 12, wherein the removing the nitride material layer comprises performing an isotropic etch process to expose surfaces of the oxide material layers.

14. The method of claim 11, wherein the memory cell layers comprise a sacrificial layer.

15. The method of claim 14, wherein the sacrificial layer is selected from the group consisting of a polysilicon material, a silicon nitride material, and an oxide material.

16. The method of claim 15, wherein the sacrificial layer comprises an arsenic doped polysilicon material.

17. The method of claim 11, wherein the plurality of oxide material layers comprise silicon dioxide.

18. The method of claim 17, wherein the nitride material layer comprises silicon nitride.

19. The method of claim 11, wherein a thickness of each oxide material layer of the plurality of oxide material layers and a thickness of the nitride material layer is about 10 nm or less.

20. The method of claim 11, wherein each of the nitride material layers are in contact with a pair of oxide material layers.

* * * * *